(12) United States Patent
Kim

(10) Patent No.: US 7,652,420 B2
(45) Date of Patent: Jan. 26, 2010

(54) ORGANIC ELECTROLUMINESCENT DEVICE AND METHOD FOR FABRICATING THE SAME

(75) Inventor: Chang Nam Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 139 days.

(21) Appl. No.: 11/963,437

(22) Filed: Dec. 21, 2007

(65) Prior Publication Data

US 2009/0140636 A1    Jun. 4, 2009

(30) Foreign Application Priority Data

Nov. 29, 2007   (KR) .................. 10-2007-0122571

(51) Int. Cl.
*H01L 51/52* (2006.01)
*H01L 51/50* (2006.01)
*H05B 33/02* (2006.01)

(52) U.S. Cl. ............... 313/503; 313/504; 313/500; 313/505; 313/506

(58) Field of Classification Search .......... 313/500–512
See application file for complete search history.

(56) References Cited

U.S. PATENT DOCUMENTS

| 6,705,912 B2 | 3/2004 | Sasatani et al. |
| 6,911,960 B1 | 6/2005 | Yokoyama |
| 6,936,846 B2 | 8/2005 | Koyama et al. |
| 2004/0245920 A1* | 12/2004 | Nakamura .................. 313/503 |
| 2005/0174051 A1* | 8/2005 | Yamazaki et al. ........... 313/506 |

FOREIGN PATENT DOCUMENTS

KR    10-2005-0079111    8/2005

OTHER PUBLICATIONS

Decision to Grant a Patent dated Nov. 26, 2008.

* cited by examiner

*Primary Examiner*—Mariceli Santiago
(74) *Attorney, Agent, or Firm*—KED & Associates, LLP (57) ABSTRACT

An organic electroluminescent device is provided having a metal wiring in a non-light-emitting region. The device may include a substrate, a wiring formed on the substrate to electrically connect to an external circuit, an insulating layer formed on the wiring such that the wiring is partially exposed. The insulating layer having a thickness 0.3 to 30 times a thickness of the wiring.

4 Claims, 9 Drawing Sheets

ORGANIC ELECTROLUMINESCENT DEVICE AND METHOD FOR FABRICATING THE SAME

The present application claims priority from Korean Application No. 10-2007-0122571, filed Nov. 29, 2007, the subject matter of which is incorporated herein by reference.

BACKGROUND

1. Field

Embodiments of the present invention may relate to an organic electroluminescence device.

2. Background

Organic electroluminescent (EL) devices may use a principle that when charge carriers are injected into an organic film formed between an electron injecting electrode (cathode) and a hole injecting electrode (anode), electrons may combine with holes to create electron-hole pairs, which may then decay to emit light.

Organic EL devices may have advantages in that the devices may be fabricated on flexible transparent substrates (e.g., plastic substrates) and may operate at a voltage (e.g., 10 V or below) lower than voltages required to operate plasma display panels (PDPs) and inorganic electroluminescent devices. Organic EL devices may also have other advantages such as relatively low power consumption and excellent color representation.

Further, since organic EL devices may emit light of three colors (i.e., green, blue and red), organic EL devices may be considered next-generation full color display devices capable of producing images of various colors.

An organic electroluminescent device may be divided into two regions, namely a light-emitting region where light-emitting pixels that generate light are formed and a non-light-emitting region where a metal wiring and a pad are formed to electrically connect with an external circuit module (or an external circuit).

BRIEF DESCRIPTION OF THE DRAWINGS

Arrangements and embodiments may be described in detail with reference to the following drawings in which like reference numerals refer to like elements and wherein.

DETAILED DESCRIPTION

Figure 1A:
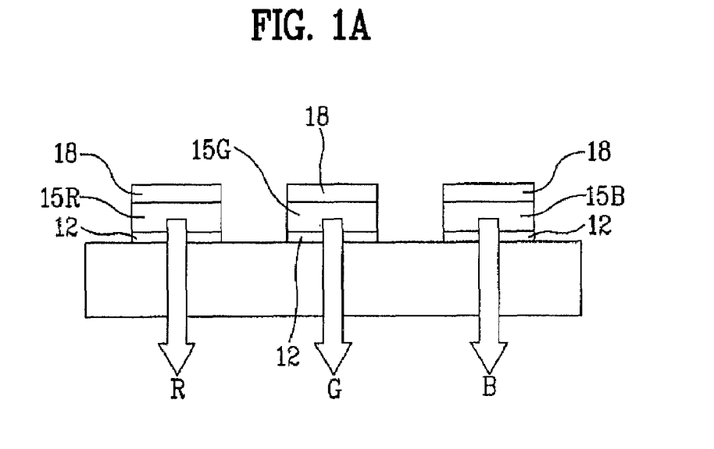
FIGS. 1A to 1C illustrate various implementations of a color image display method in an organic light emitting device
Figure 1B:
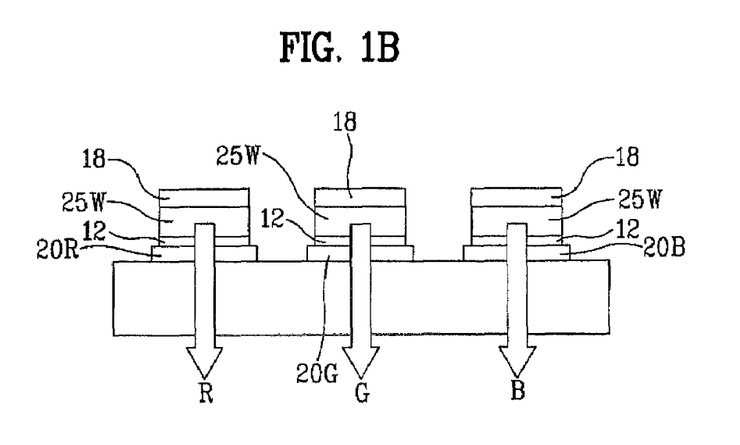
Figure 1C:
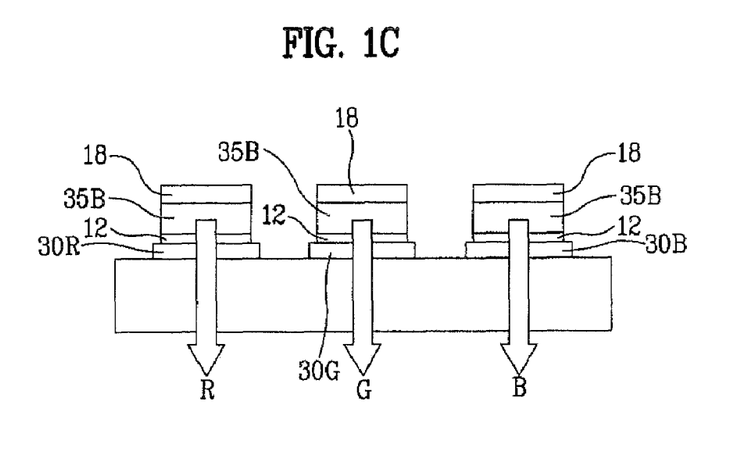

FIGS. 1A to 1C illustrate various implementations of a color image display method in an organic light emitting device. Other implementations may also be used. FIG. 1A illustrates a color image display method in an organic light emitting device that separately includes a red organic emitting layer 15R to emit red light, a green organic emitting layer 15G to emit green light and a blue organic emitting layer 15B to emit blue light. The red, green and blue light produced by the red, green and blue organic emitting layers 15R, 15G and 15B may be mixed to display a color image.

In FIG. 1A, the red, green and blue organic emitting layers 15R, 15G and 15B may each include an electron transporting layer, an emitting layer, a hole transporting layer, and the like. FIG. 1A also shows a substrate 10, an anode electrode (or anode) 12 and a cathode electrode (or cathode) 18. Different dispositions and configurations of the substrate 10, the anode electrode 12 and the cathode electrode 18 may also be used.

FIG. 1B illustrates a color image display method in an organic light emitting device that includes a white organic emitting layer 25W to emit white light, a red color filter 20R, a green color filter 20G and a blue color filter 20B.

As shown in FIG. 1B, the red color filter 20R, the green color filter 20G and the blue color filter 20B each receive white light produced by the white organic emitting layer 25W and produce red light, green light and blue light, respectively. The red, green and blue light may be mixed to display a color image. In FIG. 1B, the white organic emitting layer 25W may include an electron transporting layer, an emitting layer, a hole transporting layer, and the like.

FIG. 1C illustrates a color image display method in an organic light emitting device that includes a blue organic emitting layer 35B to emit blue light, a red color change medium 30R, a green color change medium 30G and a blue color change medium 303B.

As shown in FIG. 1C, the red color change medium 30R, the green color change medium 30G and a blue color change medium 30B each receive blue light produced by the blue organic emitting layer 35B and produce red light, green light and blue light, respectively. The red, green and blue light may be mixed to display a color image. In FIG. 1C, the blue organic emitting layer 35B may include an electron transporting layer, an emitting layer, a hole transporting layer, and the like.

Figure 2:
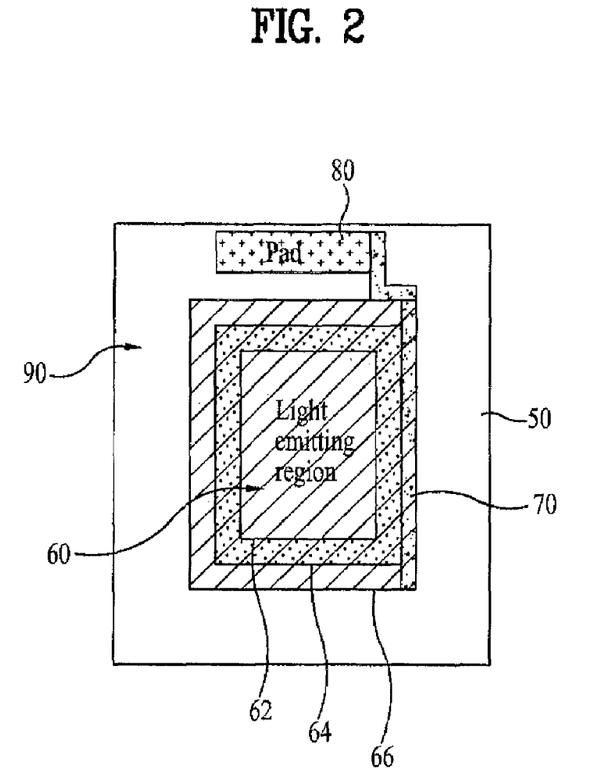
FIG. 2 is a perspective view illustrating an organic electroluminescent device according to an example arrangement.

FIG. 2 is a perspective view illustrating an organic electroluminescent device according to an example arrangement. Other arrangements may also be used. As shown in FIG. 2, the organic electroluminescent device may include a substrate 50, a light-emitting region 60 and a non-light-emitting region 90 formed on the substrate 50. The light-emitting region 60 may include an anode 62, an organic layer 64 and a cathode 66. The non-light-emitting region 90 may include a metal wiring 70 and a pad 80.

The cathode 66 in the light-emitting region 60 may be formed on the metal wiring 70 by contacting the metal wiring 70 that is electrically connected to the pad 80.

Figure 3:
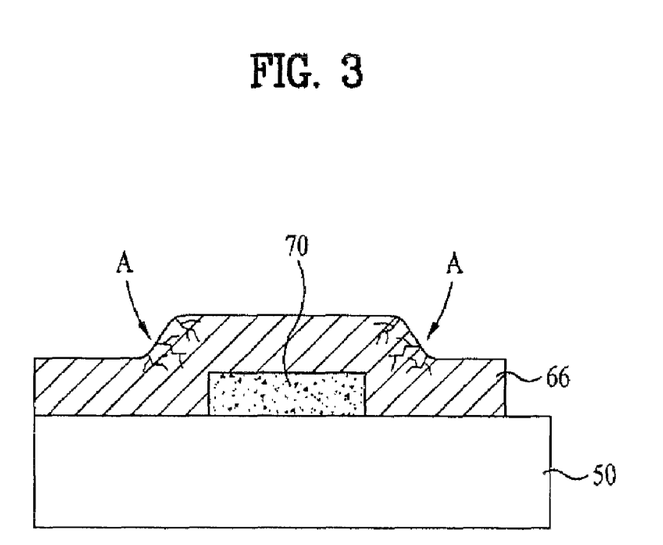
FIG. 3 is a sectional view illustrating a metal wiring contacting the cathode shown in FIG. 2.

FIG. 3 is a sectional view illustrating a metal wiring contacting a cathode (as shown in FIG. 2). As shown in FIG. 3, the cathode 66 in the light-emitting region 60 is formed on the metal wiring 70 that is electrically connected to the pad 80 so that the cathode 66 electrically connects to the pad 80. However, this structure has an electric field concentrated at an edge area (or edge) of the metal wiring 70 when a driving voltage is applied.

Since the cathode 66 formed on the edge area of the metal wiring 70 has a thickness that is smaller than the thickness of other areas of the cathode 66, cracks may be generated in the cathode 66. This may result in a short circuit of the metal wiring 70 and the cathode 66. The short circuit of the metal wiring 70 may cause deterioration in reliability of the organic electroluminescent device.

Figure 4:
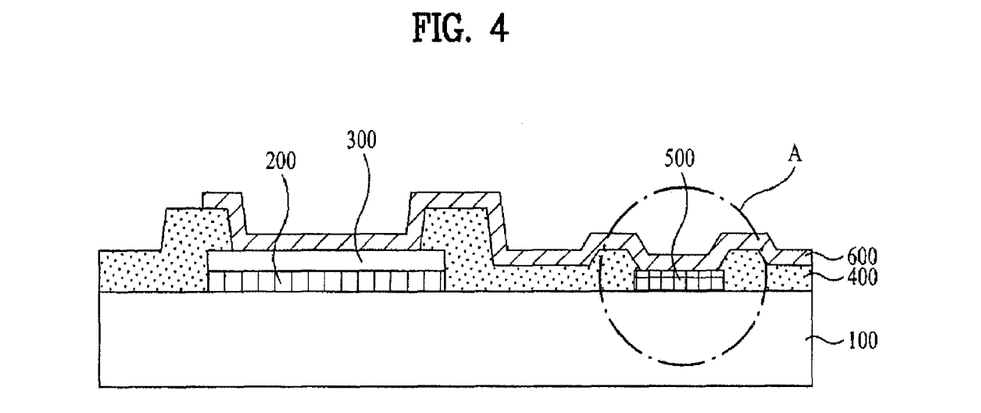
FIG. 4 is a sectional view illustrating an organic electroluminescent device according to an example embodiment of the present invention.

FIG. 4 is a sectional view illustrating an organic electroluminescent device according to an example embodiment of the present invention. Other embodiments and configurations are also within the scope of the present invention.

As shown in FIG. 4, the organic electroluminescent device may include an anode 200, an organic layer 300, an insulating layer 400, a cathode 600 and a wiring 500 formed on a substrate 100. The anode 200 may also be considered an anode electrode, and the cathode electrode 600 may also be considered a cathode electrode. The wiring 500 may be partially exposed from the insulating layer 400 to directly contact the cathode 600 such that the wiring 500 electrically connects to an external circuit.

The substrate 100 may be an insulating glass, plastic or a conductive substrate, for example.

The anode 200 may be made of indium tin oxide (ITO) or indium zinc oxide (IZO). If the anode 200 has a top emission structure, then a reflective film may also be provided.

The organic layer 300 may include at least one emissive layer, and further include a hole-injection layer, a hole-transporting layer, an electron-transporting layer, and/or an electron-injection layer.

The cathode 600 may be made of at least one of Mg, Ag, Al, Ca and/or an alloy thereof having a low work function.

The substrate 100 may further include a thin film transistor including a semiconductor layer, a gate electrode, a source electrode, a drain electrode, etc. The thin film transistor may have a top gate structure in which the gate electrode is provided on a top of the semiconductor layer. Alternatively, the thin film transistor may have a bottom gate structure in which the gate electrode is provided on a bottom of the semiconductor layer.

The substrate 100 may further have a protective film (not shown) formed thereon to cover a light-emitting region of the substrate 100. The protective film may protect the light-emitting region of the substrate 100 from external physical and chemical actions. The protective film may be an organic film, an inorganic film and/or a composite film thereof.

The substrate 100 may further include a cap to seal the light-emitting region of the substrate 100 to protect the light-emitting region from external physical and chemical actions.

The wiring 500 may be formed using a gate electrode of a thin film transistor, a source/drain electrode and/or a same material as the anode 200. The wiring 500 may be composed of ITO, IZO, ITZO, Al, Al alloy, and/or a laminate thereof.

The laminate forming the wiring 500 may have a double layer structure consisting of ITO (or IZO or ITZO)/Al (or Al alloy) or a triple layer structure consisting of ITO (or IZO or ITZO)/Al (or Al alloy)/ITO (or IZO or ITZO) or ITO (or IZO or ITZO)/Ag/ITO (or IZO or ITZO).

The wiring 500 may be made of one selected from Cu, W, Au, Ni, Al, AlNd, Ag, Ti, Ta, Mo or an alloy or laminate thereof.

The laminate forming the wiring 500 may be a Mo/Al/Mo laminate, a Ti/Al laminate, a Ti/Al alloy laminate, a Ti/Al/Ti laminate, a Ti/TiN/Al/TiN/Ti laminate, a Ti/TiN/AlSi/TiN/Ti laminate, a Ti/Al alloy/Ti laminate, and/or the like.

The Al alloy may be AlSi, AlNd, or the like.

The wiring 500 may be connected to a power supply and a voltage applied to the wiring 500 may be a ground voltage.

The insulating layer 400 may be an interlayer insulating film, a planarizing film and/or a passivation film. The insulating layer 400 may be a single layer or a plurality of layers.

The insulating layer 400 may be made of an organic substance containing a positive-type resist material. The insulating layer 400 may be further made of an inorganic substance such as SiNx or SiOx may also be used.

The organic substance used as a material for the insulating layer 400 may be selected from a polyimide, a polyacryl or a novolac-based substance.

The insulating layer 400 may have a multilayer structure by laminating an organic layer and an inorganic layer.

The insulating layer 400 may further include a protector, a photoacid-generator and/or the like.

The protector may be any one substance selected from t-butyl, tetrahydropyranyl, methyltetrahydropyranyl, tetrahydrofuranyl, methyltetrahydrofuranyl, methoxyethyl, 2-methoxypropyl, epoxyethyl, 2-ethoxypropyl, t-butoxyethyl, acetoxyethoxyethyl, acetoxymethyl, t-butoxycarbonyl, isobutoxyethyl and/or the like.

The photoacid-generator may be any compound capable of generating acid by light. The photoacid-generator may be any one substance selected from phthalimido trifluoromethane sulfonate, dinitrobenzyltosylate, n-decyl disulfone, naphthylimidotrifluoromethane sulfonate) and/or the like.

The insulating layer 400 may be formed on the wiring 500 such that the wiring 500 is partially exposed and is partially covered by the insulating layer 400.

The insulating layer 400 formed on the wiring 500 may be patterned to optimize a side wall inclination angle θ of the remaining insulating layer 400 and so as to smoothly contact the wiring 500 to the cathode 600.

The insulating layer 400 may be deposited using spin coating, slit coating and/or the like. The insulating layer 400 may also be patterned using a photolithography method.

The insulating layer 400 may remain at an edge area of the wiring 500 such that a center area of the wiring 500 is exposed from the insulating layer 400. This may allow the cathode 600 to directly contact the wiring 500.

Figure 5:
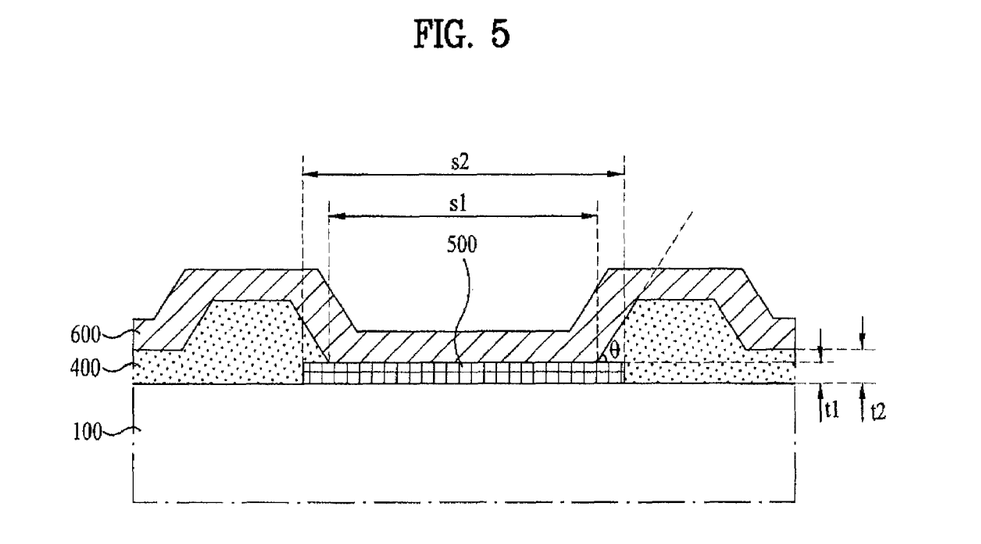
FIG. 5 is a magnified view of area A in FIG. 4.

FIG. 5 is a magnified view of area A in FIG. 4. As shown in FIG. 5, the insulating layer 400 may have a thickness t2 at an edge area, and the wiring 500 may have a thickness t1 throughout the entire length of the wiring from a first end (or first edge area) to a second end (or second edge area). The thickness t2 of the insulating layer 400 may be a minimum thickness of the insulating layer 400. The thickness t2 of the insulating layer 400 at the edge area may be 0.3 to 30 times the thickness t1 of the wiring 500, for example.

Stated differently, the insulating layer 400 extends from a first portion of the insulating layer 400 on a first end of the wiring 500 to a second portion of the insulating layer 400 on the substrate 100. The second portion of the insulating layer 400 may correspond to an area of the insulating layer 400 at the right side of FIG. 5. The thickness of the insulating layer 400 at the second portion may be a minimum thickness (or smallest thickness) of the insulating layer 400 between the first portion and the second portion of the insulating layer.

The insulating layer 400 may have such a thickness so that the insulating layer 400 that remains on the wiring 500 has a side wall inclination angle θ of approximately 10 degrees to 55 degrees. For example, when the side wall inclination angle θ of the insulating layer 400 is 10 degrees to 55 degrees, a contact area of the cathode 600 and the wiring 500 may be maximized (or increased). This may result in a smooth electrical connection. Since the insulating layer 400 is at an end (or edge area) of the wiring 500, the cathode 600 may not be influenced by the electric field of the wiring 500 so that a short circuit phenomenon may not be generated. Reliability of the device may therefore be improved.

As one example, the thickness t2 of the insulating layer 400 may be 0.2 μm to 3 μm. The thickness t1 of the wiring 500 may be approximately 0.1 μm to 0.7 μm.

Figure 6A:
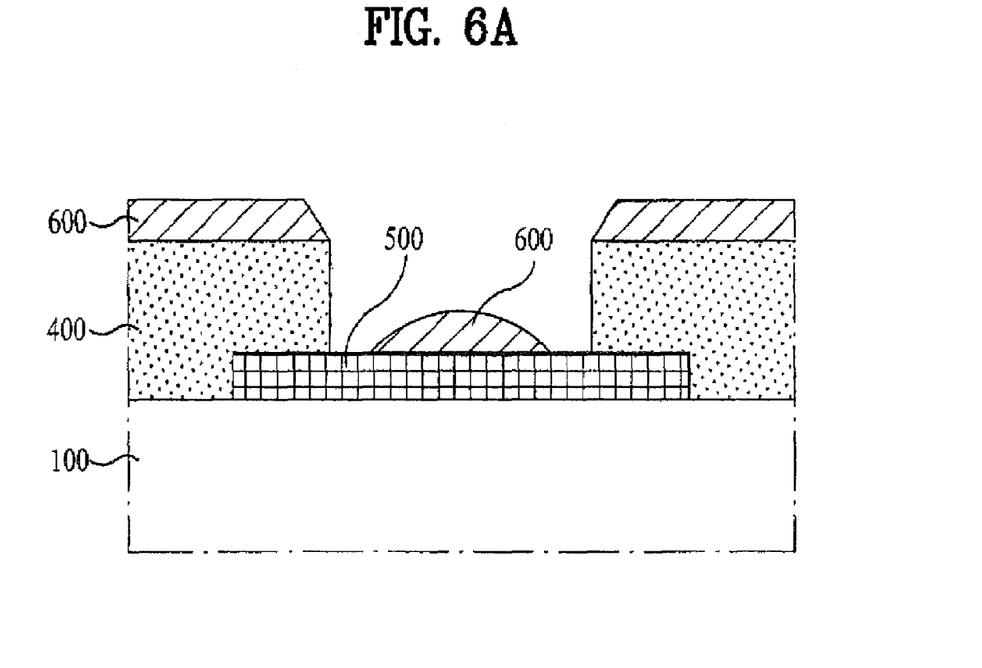
FIGS. 6A and 6B are drawings illustrating deposition shapes of a cathode depending on thickness of an insulating film according to an example embodiment of the present invention.

When the insulating layer 400 has a thickness t2 exceeding 30 times the thickness t1 of the wiring 500, the side wall inclination angle θ of the patterned insulating layer may be too large. Thus, as shown in FIG. 6A, the electrical contact between the cathode 600 and the wiring 500 may not be smooth, thereby possibly generating a short circuit.

Figure 6B:
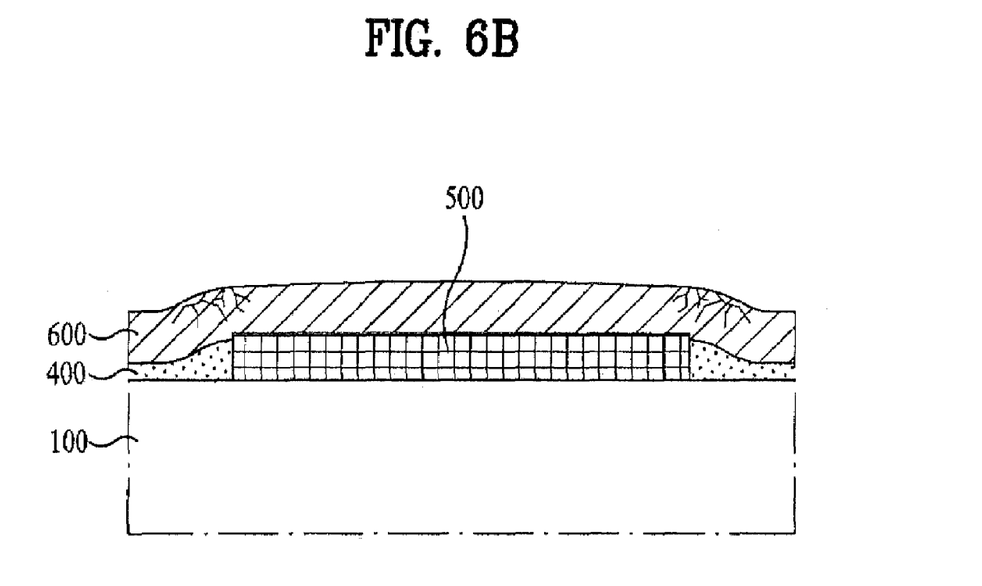

On the other hand, when the insulating layer 400 has a thickness t2 less than 0.3 times the thickness t1 of the wiring 500 as shown in FIG. 6B, the patterned insulating layer may not remain on the wiring 500, but may only remain next to side walls of the wiring 500, thereby exposing an upper surface of the wiring 500. In this circumstance, when the cathode 600 is formed on the exposed wiring 500, the electric field may be concentrated at the edge area (or end) of the wiring 500.

Therefore, since the thickness of the cathode 600 on the edge area of the wiring 500 is thinner than other areas of the cathode 600, cracks may be generated in the cathode 600, and a short circuit of the wiring 500 and the cathode 600 may be generated.

FIG. 5 shows an exposed area S1 of the wiring 500 that is not covered by the insulating layer 400. FIG. 5 also shows a total surface area S2 as a total surface area of a surface of the wiring 500 that faces away from the substrate 100. The exposed area S1 of the wiring 500 may be 50% to 97% of the total surface area S2 of the wiring 500. When the exposed area S1 of the wiring 500 is less than 50% of the total surface area S2, then the edge area of the wiring 500 may be exposed. Cracks and a short circuit of the cathode 600 may thereby be generated due to concentration of the electric field. When the exposed area S1 of the wiring 500 exceeds 97% of the total surface area S2, then the exposed area of the wiring 500 may be too narrow. Thereby, the electrical contact between the cathode 600 and the wiring 500 may not be smooth so that a short circuit is generated.

FIG. 5 also shows that the insulating layer 400 may be provided on a second end of the wiring 500. In FIG. 5, the second end of the wiring 500 may be considered the left end of the wiring 500. The insulating layer 400 may further extend from a third portion of the insulating layer 400 on the third end of the wiring 500 to a fourth portion of the insulating layer 400 on the substrate 100. The third portion of the insulating portion 400 may correspond to an area of the insulating layer 400 at the left side of FIG. 5. The thickness of the insulating layer may also be t2, and may be a minimum thickness (or smallest thickness) of the insulating layer 400 between the third portion and the fourth portion. The thickness of the insulating layer 400 may be 0.3 to 30 times a thickness of the wiring at the second end of the wiring 500. The insulating layer on the second end of the wiring 500 may have a side wall inclination angle of 10 degrees to 55 degrees with respect to a surface of the wiring 500 that faces away from the substrate 100.

A method for fabricating an organic electroluminescent device having the above structure will now be described.

Figure 7A:
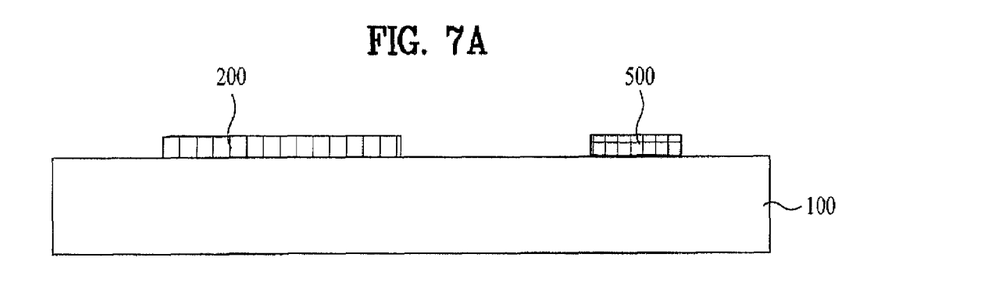
FIGS. 7A to 7E are sectional views illustrating a fabricating process of an organic electroluminescent device according to an example embodiment of the present invention.

FIGS. 7A to 7E are sectional views illustrating a fabrication process of an organic electroluminescent device according to an example embodiment of the present invention. Other embodiments and configurations are also within the scope of the present invention. As shown in FIG. 7A, the anode 200 and the wiring 500 may be simultaneously formed (or provided) on the substrate 100. The anode 200 and the wiring 500 may also be formed (or provided) separately on the substrate 100.

The wiring 500 may be formed simultaneously with a gate electrode of a thin film transistor or a source/drain electrode.

Figure 7B:
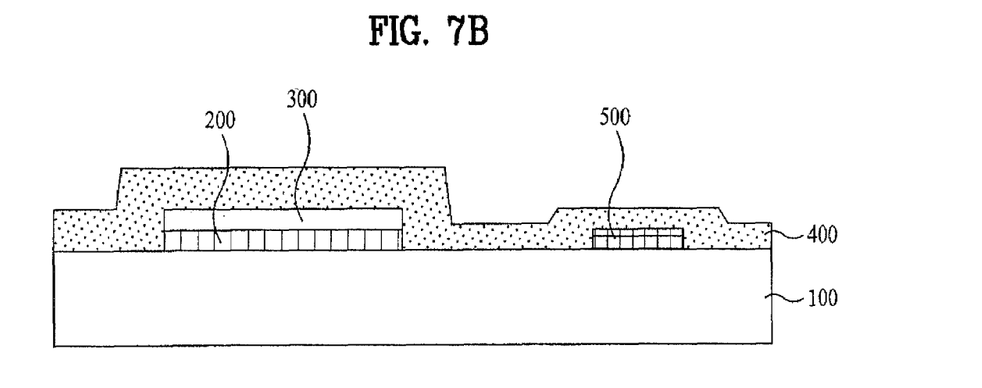

As shown in FIG. 7B, the organic layer 300 may be formed on the anode 200, and the insulating layer 400 may be formed on a top surface of the substrate 100 and on surfaces of the organic layer 300 and the wiring 500.

The insulating layer 400 may have a thickness t2 that is 0.3 to 30 times a thickness t1 of the wiring 500. The insulating layer 400 may have this thickness in order to have the side wall inclination angle θ be approximately 10 degrees to 55 degrees.

The side wall inclination angle θ may be defined as an angle between a side wall of the insulating layer 400 with respect to a surface of the wiring 500 that faces away from the substrate 100.

When the thickness t2 of the insulating layer 400 exceeds 30 times the thickness t1 of the wiring 500, the side wall inclination angle θ of the patterned insulating layer 400 may be too large. Thus, the electrical contact between the cathode 600 and the wiring 500 may not be smooth, and a short circuit may be generated.

When the thickness t2 of the insulating layer 400 is less than 0.3 times the thickness t1 of the wiring 500, then the patterned insulating layer 400 may not remain on the wiring 500, thereby exposing a surface of the wiring 500 that faces away from the substrate 100. Accordingly, the electric field may be concentrated at the edge area of the wiring 500 and a short circuit of the wiring 500 and the cathode 600 may be generated.

The insulating layer 400 may be formed using a process method such as a spin coating or a slit coating.

Figure 7C:
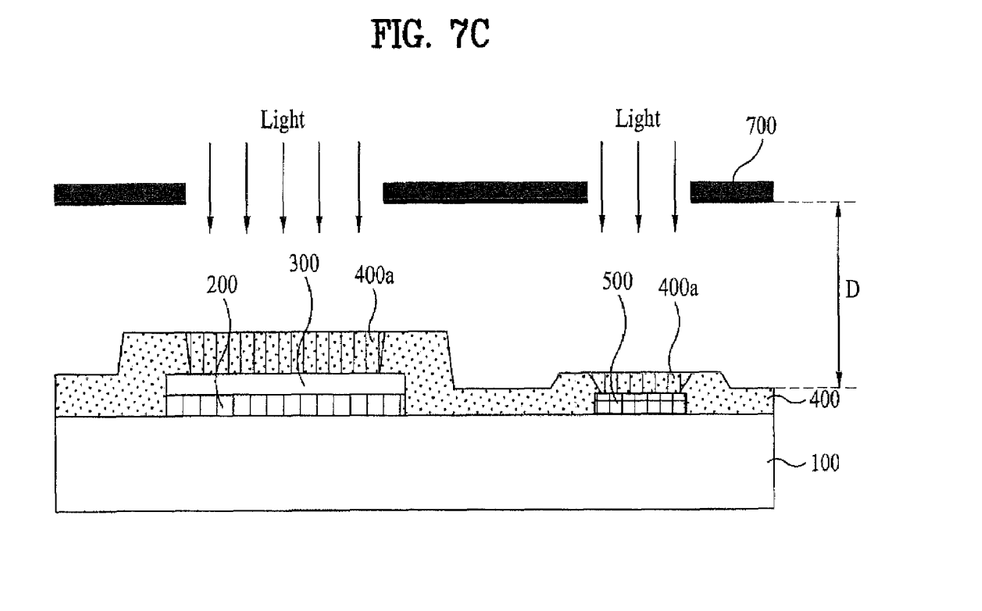

As shown in FIG. 7C, a mask 700 having a predetermined pattern may be provided for patterning the insulating layer 400. The mask 700 may be aligned at a position apart from the insulating layer 400 and have a predetermined space therebetween.

The surface of the insulating layer 400 and the mask 700 may be separated by a space D of approximately 50 μm to 200 μm.

The space D may be defined as a distance between the upper most surface of the insulating layer 400 formed on the wiring 500 and a surface of the mask 700 facing the insulating layer 400. The space D may be an important condition since the surface area of the removed insulating layer 400 and the side wall inclination angle θ of the insulating layer 400 may be determined depending on this space.

When the space D exceeds 200 μm, the surface area of the insulating layer 400 exposed to light may be too wide. Thus, upon developing the insulating layer 400, the insulating layer 400 may not remain at the edge area of the wiring 500.

Further, when the space D is less than 50 μm, the surface area of the insulating layer 400 exposed to light may be too narrow. Thus, upon developing the insulating layer 400, the exposed area of the wiring 500 may be narrow so electrical contact with the cathode 600 may not be smooth.

The insulating layer 400 may be light-exposed by selectively transmitting light through the mask 700.

The light-exposed region 400a of the insulating layer 400 may become a partial area of the organic layer 300 and a partial area of the wiring 500.

The insulating layer 400 may be exposed in a light amount of 50 mJ/cm$^2$ to 500 mJ/cm$^2$, and the light used upon the exposure may have a wavelength in a range of 150 nm to 450 nm.

Figure 7D:
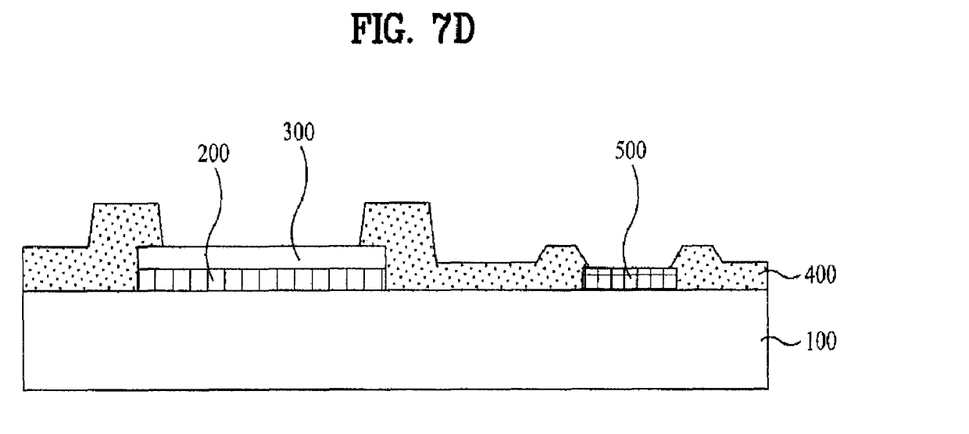

As shown in FIG. 7D, the light-exposed insulating layer 400 may expose predetermined areas of the organic layer 300 and the wiring 500.

A developing solution used in development of the insulating layer 400 may be any one selected from an aqueous inorganic alkali solution including sodium hydroxide, potassium hydroxide, sodium silicate or ammonia, an aqueous primary amine solution including ethylamine or propylamine, an aqueous secondary amine solution including diethylamine or dipropylamine, an aqueous tertiary amine solution including trimethylamine or triethylamine, an aqueous alcoholamine solution including diethylethanolamine or triethanolamine, or an aqueous quaternary ammonium hydroxide solution including tetramethylammonium hydroxide, tetraethylammonium hydroxide, trimethylhydroxymethylammonium hydroxide, triethylhydroxymethylammonium hydroxide and/or trimethylhydroxyethylammonium hydroxide.

Additionally, a paddle method, a shower method and/or the like may also be used as a developing method.

Figure 7E:
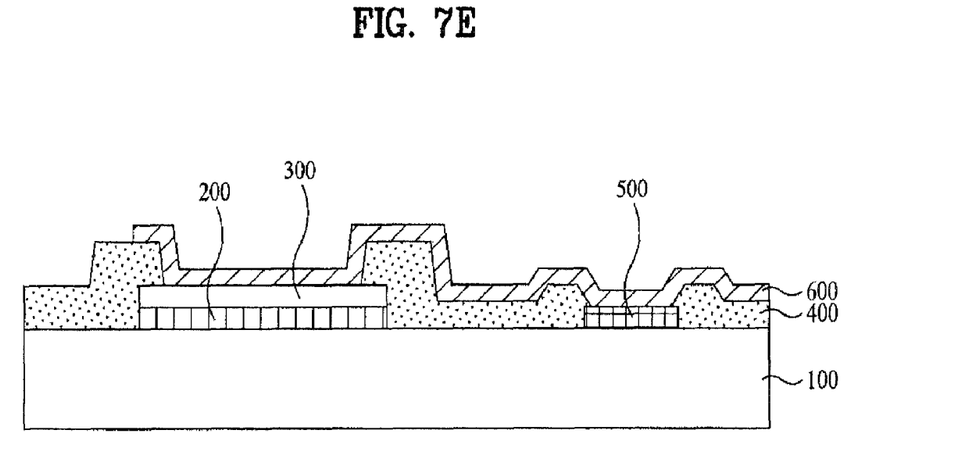

As shown in FIG. 7E, the cathode 600 may be formed such that the cathode 600 contacts the exposed organic layer 300 and directly contacts the exposed wiring 500.

The organic electroluminescent device and the method for fabricating the same may include the insulating layer 400 having a thickness t2 approximately 0.3 to 30 times a thickness t1 of the wiring 500 such that the insulating layer 400 remaining at the edge area of the wiring 500 has a side wall inclination angle θ of 10 degrees to 55 degrees.

The contact area of the cathode 600 and the wiring 500 can be maximized (or increased) so that the electrical connection is smooth. Moreover, since the insulating layer 400 does not remain at the edge area of the wiring 500, the cathode 600 may not be influenced by the electric field of the wiring 500 and so that a short circuit phenomenon may not be generated. Reliability of the device may be improved.

The following Table 1 illustrates thickness and a side wall inclination angle of an insulating layer based on a type of wiring.

TABLE 1

| Type of Wiring Substance | Type of Insulating Layer | Thickness Ratio of Insulating Layer to Wiring | Side Wall Inclination Angle of Insulating Layer |
|---|---|---|---|
| Gate electrode | (Pixel insulating film)/(planarizing film)/passivation film/interlayer insulating film | 2 to 15-fold | 11 to 27 degrees |
| Source/drain electrode | (Pixel insulating film)/(planarizing film)/passivation film | 0.3 to 5-fold | 10 to 15 degrees |
| Anode | (Pixel insulating film)/(planarizing film) | 10 to 30-fold | 17 to 55 degrees |

As may be seen from Table 1, when the wiring is formed simultaneously with the gate electrode, the insulating layer formed on the wiring may include an interlayer insulating film a passivation film, a planarizing film, and a pixel insulating film. The planarizing film and the pixel insulating film may be omitted.

A thickness ratio of the insulating layer to the wiring may be 2 to 15-fold. When the insulating layer is patterned to expose the wiring, the side wall inclination angle θ of the insulating layer may become 11 degrees to 27 degrees.

The thickness ratio of the insulating layer to the wiring may be 2 to 13-fold, and the side wall inclination angle θ of the insulating layer may be 11 degrees to 20 degrees.

When the wiring is formed simultaneously with the source/drain electrode, the insulating layer formed on the wiring may include a passivation film, a planarizing film and a pixel insulating film. The planarizing film and the pixel insulating film may be omitted.

A thickness ratio of the insulating layer to the wiring may be 0.3 to 5-fold. When the insulating layer is patterned to expose the wiring, the side wall inclination angle of the insulating layer may become 10 degrees to 15 degrees.

The thickness ratio of the insulating layer to the wiring may be 1.1 to 5-fold, and the side wall inclination angle θ of the insulating layer may be 11 degrees to 15 degrees.

When the wiring is formed simultaneously with the anode, the insulating layer formed on the wiring may include a planarizing film and a pixel insulating film. The planarizing film or the pixel insulating film may be omitted.

A thickness ratio of the insulating layer to the wiring may be 10 to 30-fold. When the insulating layer is patterned to expose the wiring, the side wall inclination angle of the insulating layer may become 17 degrees to 55 degrees.

The thickness ratio of the insulating layer to the wiring may be 10 to 13-fold, and the side wall inclination angle of the insulating layer may be 17 degrees to 20 degrees.

Figure 8:
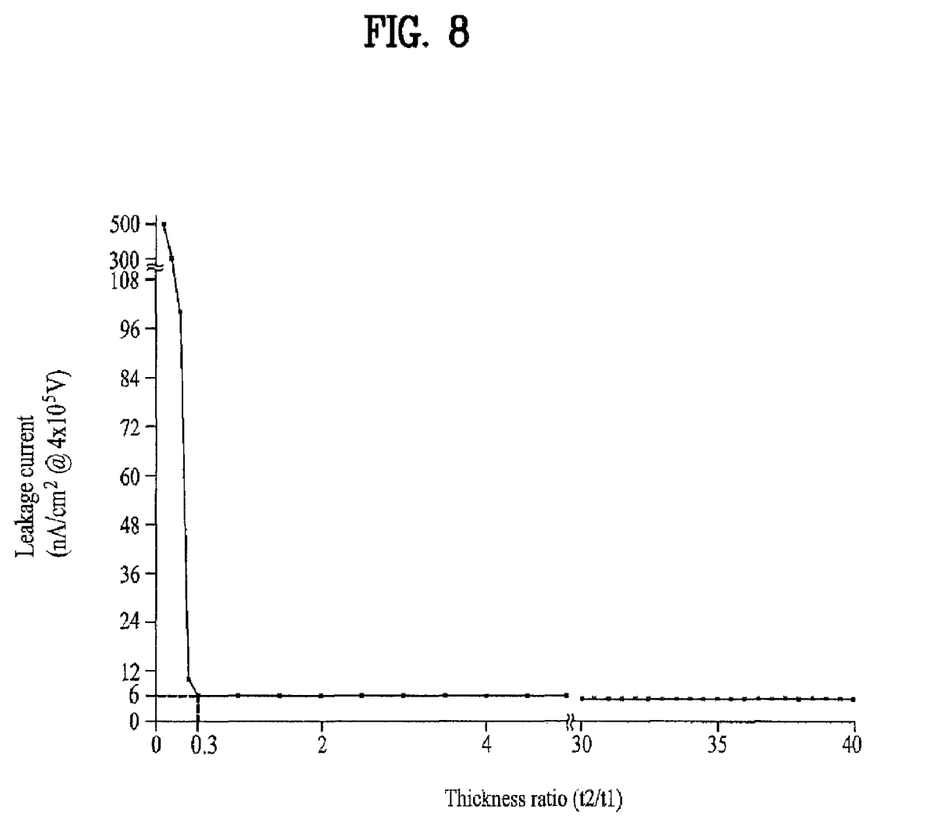
FIG. 8 is a graph illustrating variations in leakage current in response to a thickness ratio of an insulating layer to wiring according to an example embodiment of the present invention.

FIG. 8 is a graph illustrating variations in leakage current in response to a thickness ratio of an insulating layer to a wiring according to an example embodiment of the present invention. Other embodiments, configurations and graphs are also within the scope of the present invention.

As shown in FIG. 8, when the thickness ratio of the insulating layer to the wiring (t2/t1) is at least 0.3, the leakage current of the wiring may be approximately 6 nA/cm$^2$ or less.

When the leakage current of the wiring is about 6 nA/cm$^2$ or greater, the device may become unstable, and efficiency and lifespan of the device may deteriorate.

Therefore, in order to stabilize the device, embodiments of the present invention may limit a thickness ratio of the insulating layer to the wiring to 0.3 to 30-fold so as to minimize leakage current.

Figure 9:
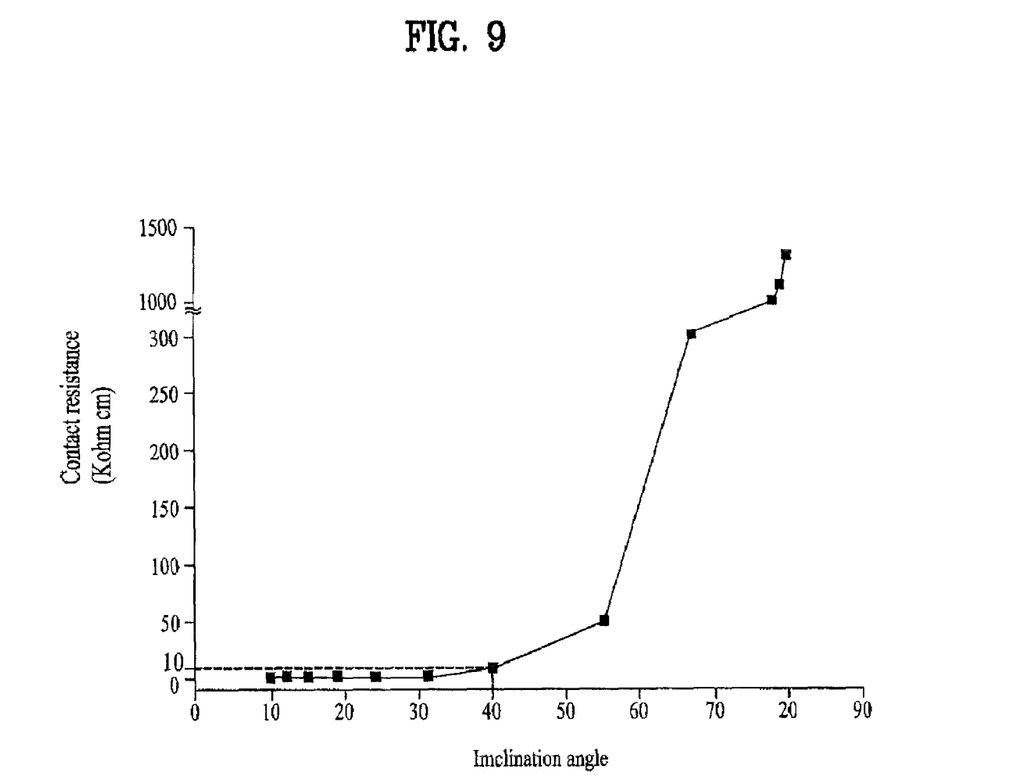
FIG. 9 is a graph illustrating variations in contact resistance in response to a side wall inclination angle of an insulating layer according to an example embodiment of the present invention.

FIG. 9 is a graph illustrating variations in contact resistance in response to a side wall inclination angle of an insulating layer according to an example embodiment of the present invention. Other embodiments, configurations and graphs are also within the scope of the present invention.

As shown in FIG. 9, when the side wall inclination angle of the insulating layer is about 55 degrees or less, the contact resistance between the wiring and the cathode may be approximately 10 Kohm cm or less.

When the contact resistance between the wiring and the cathode is approximately 10 Kohm cm or greater, the device may become unstable. In order to stabilize the device, embodiments of the present invention may limit contact resistance of the wiring and the cathode to approximately 10 Kohm cm or less, and the side wall inclination angle of the insulating layer with respect to the surface of the wiring to 10 to 55 degrees.

Figure 10:
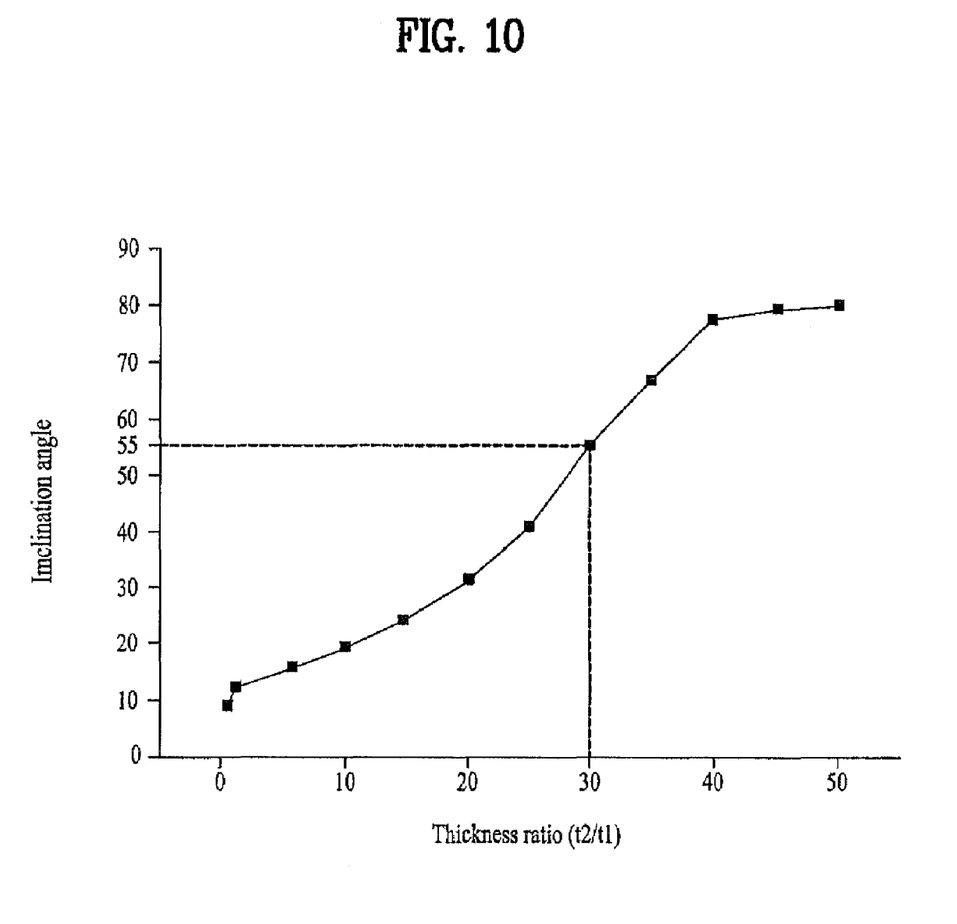
FIG. 10 is a graph illustrating variations in a side wall inclination angle of an insulating layer in response to a thickness ratio of an insulating layer to wiring according to an example embodiment of the present invention.

FIG. 10 is a graph illustrating variations in a side wall inclination angle of an insulating layer in response to a thickness ratio of an insulating layer to wiring according to an example embodiment of the present invention. Other embodiments, configurations and graphs are also within the scope of the present invention.

As shown in FIG. 10, when the thickness ratio of the insulating layer to the wiring is about 0.3 to 30-fold, the side wall inclination angle of the insulating layer with respect to the surface of the wiring may be approximately 10 degrees to 55 degrees.

In order to stabilize the device, embodiments of the present invention may determine a thickness ratio of the insulating layer to the wiring (t2/t1) such that a most ideal side wall inclination angle of the insulating layer may be exhibited by considering the leakage current and the contact resistance.

The organic EL device discussed above may include a plurality of unit pixels provided in the light emitting region (such as the light emitting region 60 in FIG. 2). Each unit pixel may include a plurality of subpixels. For example, FIGS. 1A-1C show different arrangements of red, blue, green and white light emitting layers to produce various combinations of red, blue and green light. Other combinations and/or colors may be used. The light emitting layers of the subpixels may include phosphorescence material and/or fluorescence material. The arrangements of FIGS. 1A-1C may be provided within any of the embodiments of the present invention and/or any display associated with any one of FIGS. 2-7E.

In a case where the subpixel emits red light, the emitting layer of the subpixel may include a host material including carbazole biphenyl (CBP) or 1,3-bis(carbazol-9-yl (mCP), and may be formed of a phosphorescence material including a dopant material including PIQIr(acac)(bis(1-phenylisoquinoline)acetylacetonate iridium), PQIr(acac)(bis(1-phenylquinoline)acetylacetonate iridium), PQIr(tris(1-phenylquinoline)iridium), or PtOEP(octaethylporphyrin platinum) or a fluorescence material including PBD:Eu (DBM)3(Phen) or Perylene.

In the case where the subpixel emits green light, the emitting layer may include a host material including CBP or mCP, and may be formed of a phosphorescence material including a dopant material including Ir(ppy)3(fac tris(2-phenylpyridine)iridium) or a fluorescence material including Alq3(tris (8-hydroxyquinolino)aluminum).

In the case where the subpixel emits blue light, the emitting layer may include a host material including CBP or mCP, and may be formed of a phosphorescence material including a dopant material including (4,6-F2ppy)2Irpic or a fluorescence material including spiro-DPVBi, spiro-6P, distyrylbenzene (DSB), distyryl-arylene (DSA), PFO-based polymers, PPV-based polymers, or a combination thereof.

Embodiments of the present invention may provide an organic electroluminescent device capable of improving reliability of the device by electrically contacting an electrode with a metal wiring smoothly (and directly).

Embodiments of the present invention may provide an organic electroluminescent device that includes an anode, an organic layer, a cathode and a transistor. The electroluminescent device may further include a substrate, a wiring formed on the substrate to electrically connect to an external circuit, and an insulating layer formed on the wiring such that the wiring is partially exposed and has a thickness that is 0.3 to 30 times a thickness of the wiring. The cathode may directly contact the exposed wiring.

The insulating layer may have a thickness of 0.2 μm to 3 μm and the wiring may have a thickness of 0.1 μm to 0.7 μm.

The insulating layer may have a side wall inclination angle of 10 degrees to 55 degrees with respect to a surface of the wiring, and the wiring may have an exposed area of 50% to 97% of a total area of the wiring.

The insulating layer may have a laminated structure of one or more of an organic substance selected from polyimide, polyacryl or novolac-based substance, or an inorganic substance selected from SiNx or SiOx. The insulating layer may include a protector or a photoacid-generator.

Embodiments of the present invention may provide a method for fabricating an organic electroluminescent device that includes forming an anode and a wiring on a substrate, forming an organic layer on the anode and forming an insulating layer having a thickness of 0.3 to 30 times a thickness of the wiring on the top surface of the substrate including the wiring. The method may also include light-exposing and developing the insulating layer to expose a predetermined area of the organic layer and the wiring. The method may also include forming a cathode such that the cathode contacts the exposed organic layer and wiring.

Exposing the predetermined area of the organic layer and the wiring may include preparing a mask having a predetermined pattern for patterning the insulating layer, aligning the mask on the position departed from the insulating layer with a predetermined space in between, and light-exposing the insulating layer by selectively transmitting light through the mask. The predetermined area of the organic layer and the wiring may be exposed to develop the light-exposed insulating layer.

During the aligning of the mask, a surface of the insulting layer and the mask may have a space of 50 μm to 200 μm in between. At the light-exposing of the insulating layer, the insulating layer may be exposed in a light amount of 50 mJ/cm$^2$ to 500 mJ/cm$^2$, and the light may have a wavelength of 150 nm to 450 nm.

The organic electroluminescent device and the method for fabricating the same may have the following effects.

By having the insulating layer have a thickness that is 0.3 to 30 times a thickness of the wiring, formed at an edge area of the wiring, the contact area of the cathode and wiring may be maximized. Accordingly, the electrical connection may be smooth, and the cathode may not be influenced by an electric field of the wiring so that a short circuit phenomenon is not generated. This may improve reliability of the device.

Embodiments of the present invention may form an insulating layer on the wiring. The insulating layer may have a thickness that is 0.3 to 30 times a thickness of the wiring. Exposing the wiring by patterning with optimal conditions may optimize a side wall inclination angle of the insulating layer with respect to an exposed surface of the wiring. This may improve the contact between the wiring and a cathode, and may improve the reliability of a device by electrically contacting smoothly.

In accordance with the embodiments described herein, the emitting layer cause light to be emitted in various colors. In a case where the emitting layer emits red light, the emitting layer may include a host material including carbazole biphenyl (CBP) or 1,3-bis(carbazol-9-yl (mCP), and may be formed of a phosphorescence material including a dopant material including PIQIr(acac)(bis(1-phenylisoquinoline) acetylacetonate iridium), PQIr(acac)(bis(1-phenylquinoline) acetylacetonate iridium), PQIr(tris(1-phenylquinoline)iridium), or PtOEP(octaethylporphyrin platinum) or a fluorescence material including PBD:Eu(DBM)3(Phen) or Perylene.

In the case where the emitting layer emits red light, a highest occupied molecular orbital of the host material may range from 5.0 to 6.5, and a lowest unoccupied molecular orbital of the host material may range from 2.0 to 3.5. A highest occupied molecular orbital of the dopant material may range from 4.0 to 6.0, and a lowest unoccupied molecular orbital of the dopant material may range from 2.4 to 3.5.

In the case where the emitting layer emits green light, the emitting layer includes a host material including CBP or mCP, and may be formed of a phosphorescence material including a dopant material including Ir(ppy)3(fac tris(2-phenylpyridine)iridium) or a fluorescence material including Alq3(tris(8-hydroxyquinolino)aluminum).

In the case where the emitting layer emits green light, a highest occupied molecular orbital of the host material may range from 5.0 to 6.5, and a lowest unoccupied molecular orbital of the host material may range from 2.0 to 3.5. A highest occupied molecular orbital of the dopant material may range from 4.5 to 6.0, and a lowest unoccupied molecular orbital of the dopant material may range from 2.0 to 3.5.

In the case where the emitting layer emits blue light, the emitting layer includes a host material including CBP or mCP, and may be formed of a phosphorescence material including a dopant material including (4,6-F2ppy)2Irpic or a fluorescence material including spiro-DPVBi, spiro-6P, distyryl-benzene (DSB), distyryl-arylene (DSA), PFO-based polymers, PPV-based polymers, or a combination thereof.

In the case where the emitting layer emits blue light, a highest occupied molecular orbital of the host material may range from 5.0 to 6.5, and a lowest unoccupied molecular orbital of the host material may range from 2.0 to 3.5. A highest occupied molecular orbital of the dopant material may range from 4.5 to 6.0, and a lowest unoccupied molecular orbital of the dopant material may range from 2.0 to 3.5.

A difference between driving voltages, e.g., the power voltages VDD and Vss of the organic light emitting device may change depending on the size of the display panel 100 and a driving manner. A magnitude of the driving voltage is shown in the following Tables 1 and 2. Table 1 indicates a driving voltage magnitude in case of a digital driving manner, and Table 2 indicates a driving voltage magnitude in case of an analog driving manner.

TABLE 1

| Size (S) of display panel | VDD-Vss (R) | VDD-Vss (G) | VDD-Vss (B) |
|---|---|---|---|
| S < 3 inches | 3.5-10 (V) | 3.5-10 (V) | 3.5-12 (V) |
| 3 inches < S < 20 inches | 5-15 (V) | 5-15 (V) | 5-20 (V) |
| 20 inches < S | 5-20 (V) | 5-20 (V) | 5-25 (V) |

TABLE 2

| Size (S) of display panel | VDD-Vss (R, G, B) |
|---|---|
| S < 3 inches | 4~20 (V) |
| 3 inches < S < 20 inches | 5~25 (V) |
| 20 inches < S | 5~30 (V) |

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An organic electroluminescent device including an anode, an organic layer and a cathode, comprising:
    a substrate;
    a wiring formed on the substrate, the wiring having a first thickness in a first direction, the wiring electrically connecting to an external circuit in the first direction, the wiring extending from a first end to a second end in a second direction; and
    an insulating layer extending from a first portion of the insulating layer on the first end of the wiring to a second portion of the insulating layer on the substrate, and the insulating layer extending from a third portion of the insulating layer on the second end of the wiring to a fourth portion of the insulating layer on the substrate, the wiring being partially exposed from the insulating layer to contact the cathode, the insulating layer having a second thickness in the first direction at the second portion of the insulating layer,
    wherein the second thickness of the insulating layer at the second portion is 0.2 μm to 3 μm, and the first thickness of the wiring is 0.1 μm to 0.7 μm, and wherein the second thickness of the insulating layer at the second portion is 0.3-30 times the first thickness of the wiring, wherein thickness in the first direction of the first portion of the insulating layer is different than thickness in the first direction of the second portion of the insulating layer, and thickness of the third portion of the insulating layer is different than thickness in the first direction of the fourth portion of the insulating layer.

2. The device according to claim 1, wherein the insulating layer has a side wall inclination angle of 10 to 55 degrees.

3. The device according to claim 1, wherein the wiring has an exposed area of 50% to 97% of the total area of the wiring.

4. The device according to claim 1, wherein the insulating layer is formed at the edge area of the wiring.

* * * * *